US012176593B2

(12) United States Patent
Richman et al.

(10) Patent No.: US 12,176,593 B2
(45) Date of Patent: Dec. 24, 2024

(54) SUPERCONDUCTING VORTEX-BASED MICROWAVE CIRCULATOR

(71) Applicants: University of Maryland, College Park, College Park, MD (US); Government of the United States of America, as represented by the Secretary of Commerce, Washington, DC (US)

(72) Inventors: Brittany Richman, Laurel, MD (US); Jacob Taylor, Cambridge, MA (US)

(73) Assignees: University of Maryland, College Park, College Park, MD (US); Government of the United states of America, as represented by the Secretary of Commerce, Gaithersburg, MD (US)

( * ) Notice: Subject to any disclaimer, the term of this patent is extended or adjusted under 35 U.S.C. 154(b) by 554 days.

(21) Appl. No.: 17/477,960

(22) Filed: Sep. 17, 2021

(65) Prior Publication Data

US 2022/0094029 A1   Mar. 24, 2022

Related U.S. Application Data

(60) Provisional application No. 63/080,438, filed on Sep. 18, 2020.

(51) Int. Cl.
| H01P 1/383 | (2006.01) |
| G06N 10/00 | (2022.01) |
| H10N 60/12 | (2023.01) |
| H10N 60/80 | (2023.01) |

(52) U.S. Cl.
CPC ............. *H01P 1/383* (2013.01); *G06N 10/00* (2019.01); *H10N 60/12* (2023.02); *H10N 60/805* (2023.02)

(58) Field of Classification Search
CPC ........... H01P 1/383; H01P 1/38; G06N 10/00; G06N 10/40; H10N 60/12; H10N 60/805
See application file for complete search history.

(56) References Cited

U.S. PATENT DOCUMENTS

2015/0028970 A1*   1/2015   Chow ................... H10N 60/00
333/205

OTHER PUBLICATIONS

B. Abdo, et al., Directional Amplication with a Josephson Circuit, Physical Review, X 3, 031001, pp. 1-18, Jul. 1, 2013.
C. Macklin, et al., "A near quantum-limited Josephson traveling-wave parametric amplifier", Science, vol. 350, Issue 6258, pp. 307-310, Oct. 16, 2015.
K. M. Sliwa, et al., "Reconfigurable Josephson Circulator/Directional Amplifier", Physical Review, X 5, 041020, pp. 1-10, Nov. 5, 2015.
F. Lecocq, et al., "Nonreciprocal Microwave Signal Processing with a Field-Programmable Josephson Amplifier", Physical Review, Applied 7, 024028, pp. 1-19, Feb. 27, 2017.
S. Krinner, et al., "Engineering cryogenic setups for 100-qubit scale superconducting circuit systems", EPJ Quantum Technology 6:2, pp. 1-29 (2019).

(Continued)

*Primary Examiner* — Elias Ullah
(74) *Attorney, Agent, or Firm* — George Likourezos; Carter, DeLuca & Farrell LLP

(57) ABSTRACT

A circulator includes a central circuit having a first superconducting island, a second superconducting island, a third superconducting island, and a central island, each in electrical communication with each other via a plurality of Josephson junctions.

18 Claims, 8 Drawing Sheets

(56) References Cited

OTHER PUBLICATIONS

B. Abdo, et al., "Active protection of a superconducting qubit with an interferometric Josephson isolator", Nature Communications 10: 3154, pp. 1-10 (2019).

B. Patra, et al., "A scalable cryo-cmos 2-to-20ghz digitally intensive controller for 4×32 frequency multiplexed spin qubits/transmons in 22nm finfet technology for quantum computers", 2020 IEEE International Solid-State Circuits Conference—(ISSCC) pp. 304-306, May 7, 2020.

B. Abdo, et al., High-fidelity qubit readout using interferometric directionsl Josephson devices, arXiv:2006.01918 [quant-ph], pp. 1-32, Sep. 30, 2021.

E. I. Rosenthal, et al., "Efficient and Low-Backaction Quantum Measurement Using a Chip-Scale Detector", arXiv:2008.03805 [quant-ph], pp. 1-35, Mar. 9, 2021.

D. M. Pozar, "Microwave Engineering", University of Massachusetts at Amherst, 4th ed. Wiley, pp. 1-756, (2012).

C. Owens, et al. Quarter-flux Hofstadter Lattice in a Qubit-Compatible Microwave Cavity Array, Physical Review, A 97, 013818, pp. 1-12, Jan. 16, 2018.

G. Viola, et al., " Hall Effect Gyrtors and Circulators", Pysical Review X 4, 021019, pp. 1-18, May 2, 2014.

A. C. Mahoney, et al. "On-Chip Microwave Quantum Hall Circulator", Physical Review, X 7, 011007, pp. 1-9, Jan. 24, 2017.

S. Barzanjeh, et al., "Mechanical on-chip microwave circulator", Nature Communications 8, 953, pp. 1-7, (2017).

J. Kerckhoff et al., "On-chip superconducting microwave circulator from synthetic rotation", Physical Review, Applied 4, 034002, pp. 1-15, Sep. 10, 2015.

B. J. Chapman, et al., "Widely Tunable On-Chip Microwave Circulator for Superconducting Quantum Circuits", Physical Review, X 7, 041043, pp. 1-16, Nov. 22, 2017.

B. Abdo, et al., "Gyrator Operation Using Josephson Mixers", Physical Review Applied 8, 034009, pp. 1-10, Sep. 21, 2017.

B. J. Chapman, et al., "Design of an On-Chip Superconducting Microwave Circulator with Octave Bandwidth", Physical Review Applied 11, 044048, pp. 1-13, Apr. 16, 2019.

J.Koch, et al., "Time-reversal-symmetry breaking in circuit-QED-based photon lattices", Physical Review, A 82, 043811, pp. 1-18, Oct. 11, 2010.

C. Muller, et al., "Passive On-Chip Superconducting Circulator Using a Ring of Tunnel Junctions", Physical Review Letters, 120, 213602, pp. 1-6, May 25, 2018.

J. E. Mooij, et al., "Josephson Persistent-Current Qubit", Science, vol. 285, 1036, pp. 1-5, Aug. 13, 1999.

T. P. Orlando, et al., "Superconducting persistent-current qubit", Physical Review, vol. 60, No. 22, pp. 1-16, Dec. 1, 1999.

J. R. Friedman, et al., "Quantum superposition of distinct macroscopic states", Nature vol. 406, pp. 1-4, Jul. 6, 2000.

C.H.vander Wal, et al., "Quantum Superposition of Macroscopic Persistent-Current States", Science, vol. 290, pp. 773-777, Oct. 27, 2000.

F. Tafuri, "Fundamentals and Frontiers of the Josephson Effect", Springer Series in Materials Science, vol. 286, pp. 1-884, (2019).

R. Fazio, et al. "Quantum phase transitions and vortex dynamics in superconducting networks", Physics Reports 355, pp. 235-334, Feb. 2001.

H. van der Zant, "Quantum, ballistic vortices", Physica B: Condensed Matter 222, pp. 344-352, (1996).

R. Fazio, et al., "Quantum Fluctuations in Mesoscopic and Macroscopic Systems", World Scientfic, pp. 1-302, (1991).

D. J. Griffiths, "Introduction to Electrodynamics", 4th ed., Pearson Education Inc., pp. 1-623, (2013).

J. J. Sakurai, et al., "Modern Quantum Mechanics", 2nd ed. pp. 1-570, Addison-Wesley, (2011).

R. Newrock, et al., "The Two-Dimensional Physics of Josephson Junction Arrays", Solid State Physics, vol. 54, Academic Press, pp. 1-250, (2000).

R. Cosmic, et al., "Circuit-QED-based measurement of vortex lattice order in a Josephson junction array", Physical Review, B 98, 060501, pp. 1-6, Aug. 21, 2018.

C. W. Gardiner, et al., "Input and output in damped quantum systems: Quantum stochastic differential equations and the master equation", Physical Review A 31, 3761, pp. 1-3, Jun. 1, 1985 (Abstract Only).

D. F. Walls, et al., "Quantum Optics", 2nd ed. Springer, pp. 1-424, (2008).

L. Ranzani, et al., "Graph-based analysis of nonreciprocity in coupled-mode systems", New Journal of Physics 17, 023024, pp. 1-15, Jan. 15, 2015.

V. Fatemi, et al., "Weyl Josephson circuits", Physical Review Research 3, 013288, pp. 1-11, Mar. 29, 2021.

D. T. Le, et al., "Doubly nonlinear superconducting qubit", Physical Review Applied 100, 062321, pp. 1-16, Jan. 2, 2020.

P. Harvey-Collard, et al., "On-Chip Microwave Filters for High-Impedance Resonators with Gate-Defined Quantum Dots", Physical Review Applied 14, 034025, pp. 1-11, Sep. 10, 2020.

N. Samkharadze, et al., "High-Kinetic-Inductance Superconducting Nanowire Resonators for Circuit QED in a Magnetic Field", Physical Review Applied 5, 044004, pp. 1-8, Apr. 7, 2016.

A. J. Landig, et al., "Coherent spin-photon coupling using a resonant exchange qubit", Nature 560, pp. 1-6, (2018).

\* cited by examiner

SUPERCONDUCTING VORTEX-BASED MICROWAVE CIRCULATOR

CROSS-REFERENCE TO RELATED APPLICATION/CLAIM OF PRIORITY

This application claims the benefit of, and priority to, U.S. Provisional Patent Application No. 63/080,438, filed on Sep. 18, 2020, the entire contents of which are hereby incorporated herein by reference.

GOVERNMENT LICENSE RIGHTS

This invention was made with government support under PHY1430094 awarded by the National Science Foundation. The government has certain rights in the invention.

TECHNICAL FIELD

The present disclosure relates generally to the field of circulators. More specifically, an aspect of the present disclosure provides a superconducting vortex-based microwave circulator.

BACKGROUND

In traditional circulators, a ferrite junction is used to enable unidirectional transmission in a clockwise or counterclockwise fashion. Ferrite-based circulators are large in size and use strong magnetic fields, which presents a challenge when trying to employ ferrite-based circulators in large quantum computing schemes. Accordingly, there is interest in improving the size and corresponding magnetic field of circulators.

SUMMARY

An aspect of the present disclosure provides a circulator including a central circuit including a first superconducting island, a second superconducting island, a third superconducting island, and a central island, each in electrical communication with each other via a plurality of Josephson junctions.

In accordance with aspects of the disclosure, the circulator may be operated in a non-charge-conserved, intermediate regime of Josephson energy.

In an aspect of the present disclosure, the central circuit may define a plane.

In another aspect of the present disclosure, the central circuit may be configured to be threaded by an external magnetic field applied perpendicular to the plane.

In yet another aspect of the present disclosure, the plurality of Josephson junctions may include a Josephson energy and a capacitance.

In a further aspect of the present disclosure, a central island may include a central ground.

In yet a further aspect of the present disclosure, the central island may include a self-capacitance.

In an aspect of the present disclosure, the circulator may further include a resonator capacitively coupled to each of the first, the second, and the third superconducting islands.

In another aspect of the present disclosure, the resonators may be strongly coupled to each of the first, the second, and the third superconducting islands.

In yet another aspect of the present disclosure, the circulator may further include persistent current vortexes.

An aspect of the present disclosure provides a circulator including a plurality of superconducting islands and a central island. The plurality of superconducting islands and the central island are each in electrical communication with each other via a plurality of Josephson junctions.

In a further aspect of the present disclosure, the circulator may be operated in a non-charge-conserved, intermediate regime of Josephson energy.

In yet a further aspect of the present disclosure, the plurality of superconducting islands may define a plane.

In an aspect of the present disclosure, the circulator may be configured to be threaded by an external magnetic field applied perpendicular to the plane.

In another aspect of the present disclosure, the plurality of Josephson junctions may include a Josephson energy and a capacitance.

In yet another aspect of the present disclosure, the central island may include a central ground.

In a further aspect of the present disclosure, the central island may include a self-capacitance.

In yet a further aspect of the present disclosure, the circulator may include a resonator capacitively coupled to each of the plurality of superconducting islands.

In an aspect of the present disclosure, the circulator may further include persistent current vortexes.

In an aspect of the present disclosure, a computing system includes one or more computing devices in communication with a quantum computing system including a circulator. The circulator includes a first superconducting island, a second superconducting island, a third superconducting island, and a central island, each in electrical communication with each other via a plurality of Josephson junctions.

Further details and aspects of exemplary embodiments of the present disclosure are described in more detail below with reference to the appended figures.

BRIEF DESCRIPTION OF THE DRAWINGS

A better understanding of the features and advantages of the disclosed technology will be obtained by reference to the following detailed description that sets forth illustrative embodiments, in which the principles of the technology are utilized, and the accompanying drawings of which.

Figure 1:
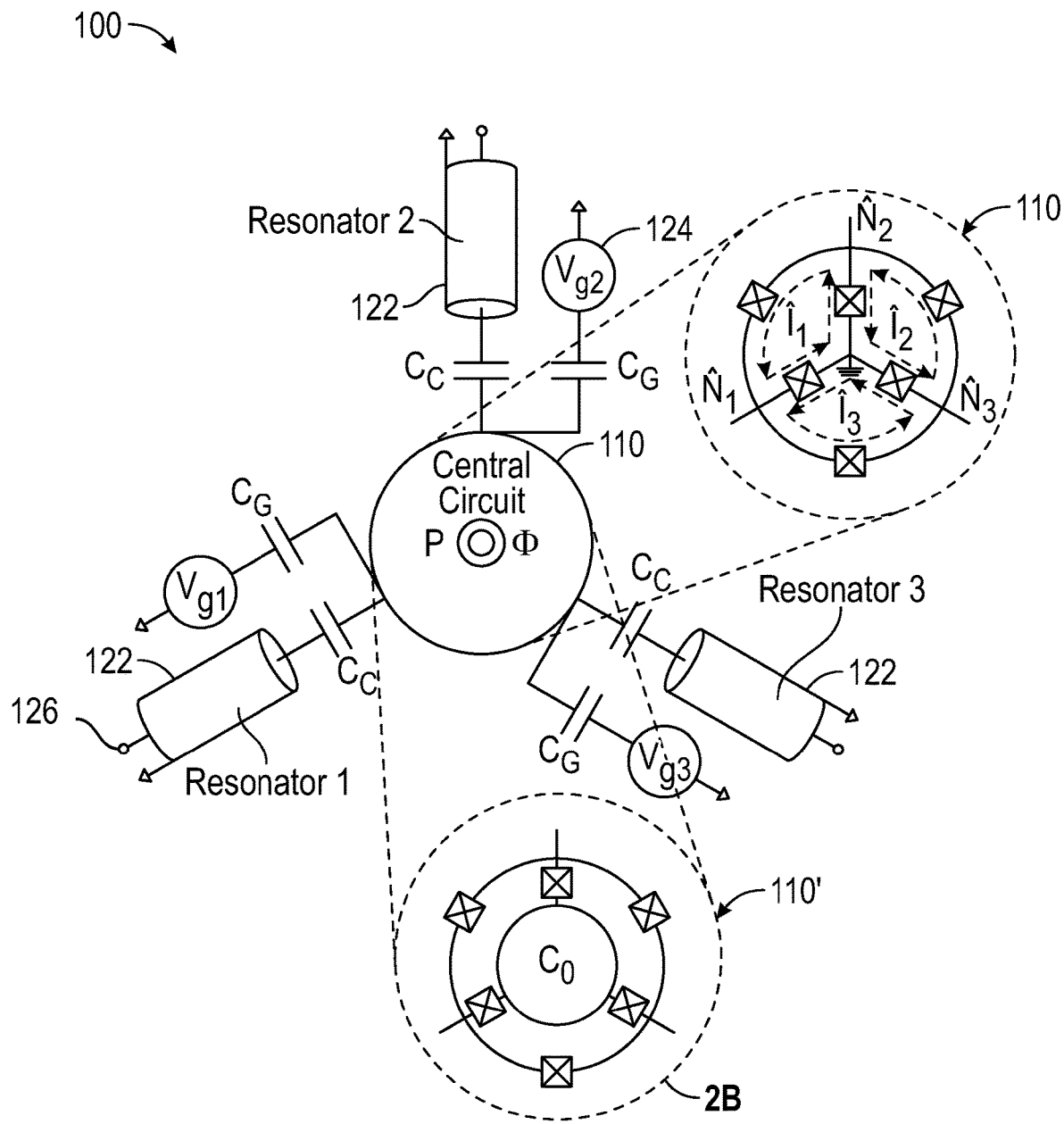
FIG. 1 illustrates a superconducting vortex-based microwave circulator, in accordance with examples of the present disclosure.

Further details and aspects of various embodiments of the present disclosure are described in more detail below with reference to the appended figures.

DETAILED DESCRIPTION

The present disclosure relates generally to the field of microwave circulators. More specifically, an aspect of the present disclosure provides a superconducting vortex-based microwave circulator.

Embodiments of the present disclosure are described in detail with reference to the drawings wherein like reference numerals identify similar or identical elements.

Although the present disclosure will be described in terms of specific examples, it will be readily apparent to those skilled in this art that various modifications, rearrangements, and substitutions may be made without departing from the spirit of the present disclosure. The scope of the present disclosure is defined by the claims appended hereto.

For purposes of promoting an understanding of the principles of the present disclosure, reference will now be made to exemplary embodiments illustrated in the drawings, and specific language will be used to describe the same. It will nevertheless be understood that no limitation of the scope of the present disclosure is thereby intended. Any alterations and further modifications of the novel features illustrated herein, and any additional applications of the principles of the present disclosure as illustrated herein, which would occur to one skilled in the relevant art and having possession of this disclosure, are to be considered within the scope of the present disclosure.

In order to scale up quantum computing devices, the supporting hardware for quantum bits (qubits) must appropriately scale down. Components for quantum computing include elements for signal routing and isolation, such as circulators, as well as low noise amplifiers, filters, and cooling systems. While development in improving miniaturization and effectiveness of these components progresses apace, traditional circulators remain bulky and require high magnetic fields for operation.

Figure 2A:
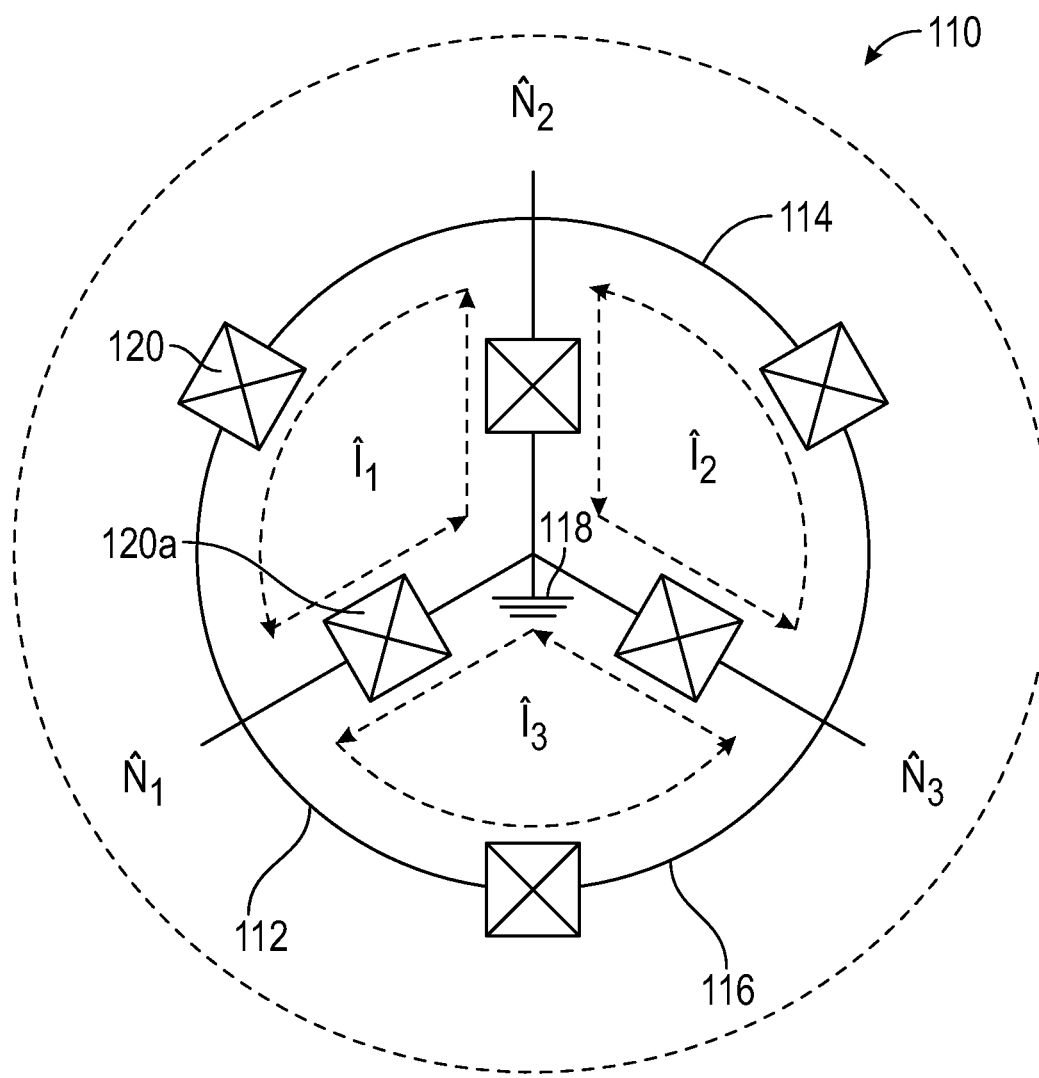
FIG. 2A illustrates a diagram for a central circuit of the microwave circulator of FIG. 1, in accordance with examples of the present disclosure.

With reference to FIGS. 1 and 2A, diagrams for a superconducting vortex-based microwave circulator 100 are shown. The superconducting vortex-based microwave circulator 100 generally includes a central circuit 110, which is configured to form a three-island Josephson junction loop. It is contemplated that the central circuit 110 may be located in any suitable place in the circulator and does not have to be at the center, for example, it may be located at a periphery, and/or offset from the center of the circulator. The central circuit 110 generally includes a first, a second, and a third superconducting island 112, 114, 116, and a central grounded island 118, each in electrical communication with each other via Josephson junctions 120. A Josephson junction 120 is a device that has two or more superconductors coupled by a weak link. The weak link may include an insulating material, a short section of non-superconducting material, and/or a physical constriction. A superconductor is generally a material that has almost no resistance when cooled below the material's critical temperature. Examples of a superconductor include but are not limited to aluminum, bismuth, niobium, and/or magnesium diboride. For example, aluminum has a critical temperature of about 1.2 degrees kelvin.

The superconducting vortex-based microwave circulator 100 operates in a non-charge-conserved, intermediate regime with Josephson energy and charging energy being similar. By keeping the Josephson energy similar to the charging energy, quantum-coherent vortex dynamics can be maintained rather than having the microwave response behavior be dominated by spin waves, as occurs at large Josephson energy. The technology of the present disclosure enables a reduction in sensitivity to charge noise while enabling large bandwidth operation.

The central circuit 110 defines a plane P (FIG. 1). The central circuit is configured to be threaded by an external magnetic field applied perpendicular to the plane $\Phi$. The Josephson junctions 120 include a Josephson energy and a capacitance.

Figure 2B:
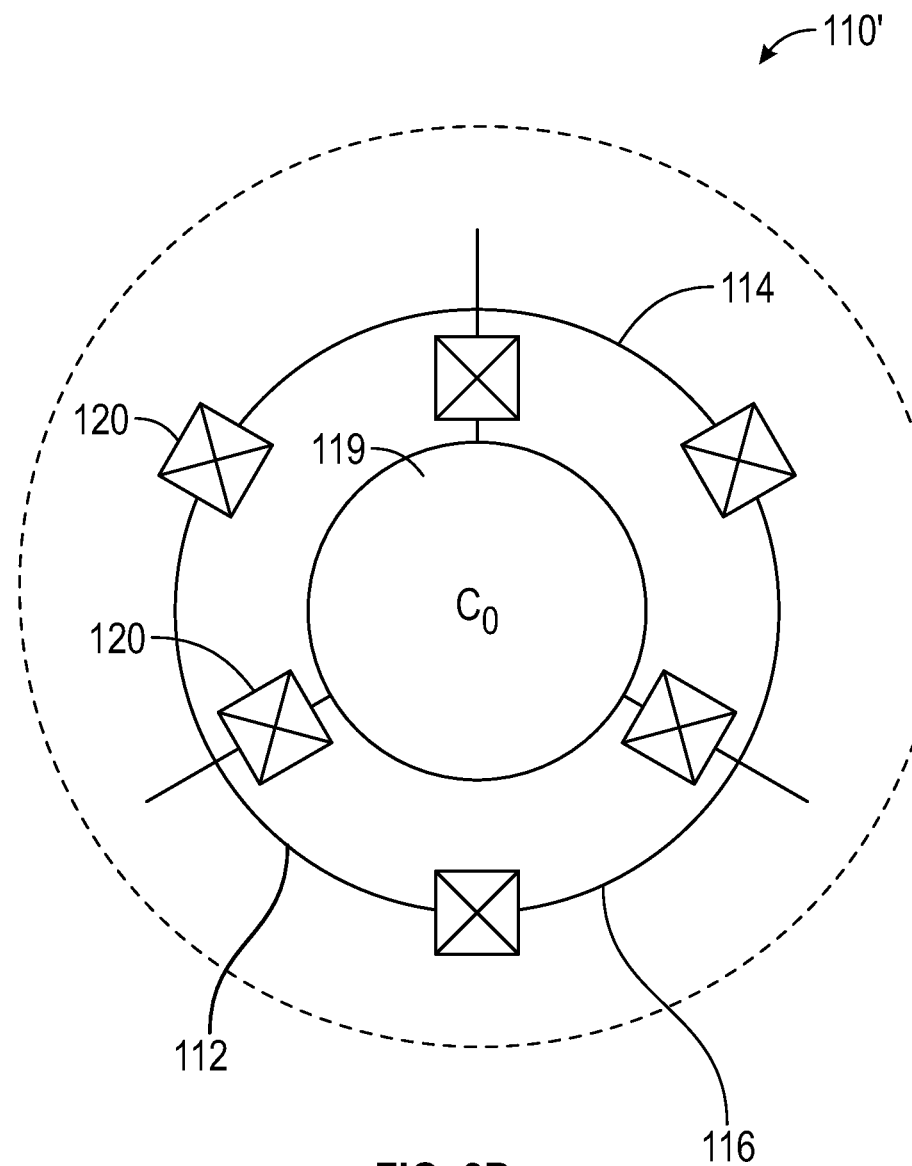
FIG. 2B illustrates a diagram for the central circuit of the microwave circulator of FIG. 1 with a central island, in accordance with examples of the present disclosure

With reference to FIG. 2A, the central circuit 110 consists of three superconducting islands 112, 114, 116, connected to each other and a central grounded island 118 via Josephson junctions 120, all threaded by an external flux $\Phi$. With reference to FIG. 2B, the central grounded island 118 of central circuit 110' may be replaced by a capacitive central island 119 with self-capacitance $C_0 \gg C_J$, the nominal capacitance of each island. In aspects, there is a mutual capacitance $C\mu$ between the large central island and each of the three outer islands. For example, C0 may be about $30{*}C_J$ and $C\mu$ may be about $0.25{*}C_J$.

For the central circuit 110 of FIG. 2A, the overall Hamiltonian function is:

$$H_{CC} = 4E_\Sigma(\hat{\underline{N}} - \underline{N}_g)^T \underline{\underline{K}}^{-1} (\hat{\underline{N}} - \underline{N}_g) + E_J V(\hat{\underline{\varphi}}, \Phi).$$

The operators $\hat{\underline{N}}$ and $\hat{\underline{\varphi}}$ are the vectors of number and phase operators for each island of the circuit, with individual elements satisfying the commutation relation $[\hat{\varphi}_j, \hat{N}_k] = i\delta_{jk}$. $E_J$ is the Josephson energy of each junction and $E_\Sigma$ is the circuit's charging energy, defined as $$E_\Sigma = \frac{e^2}{2C_M}$$

where $C_M$ is the largest eigenvalue of the circuit's capacitance matrix $\underline{\underline{C}}$, defined below. $\underline{\underline{K}}^{-1}$ is the dimensionless inverse capacitance matrix appropriate for the circuit, found by factoring $C_M$ from $\underline{\underline{C}}^{-1}$. $H_{CC}$ only stipulates the central circuit be a superconducting, three-island system containing identical Josephson junctions 120. By specifying the elements of $\underline{\underline{K}}^{-1}$ and the tunneling potential $V(\underline{\varphi}, \Phi)$ the particular central circuit is established.

$\underline{\underline{K}}^{-1}$ is defined by inverting the capacitance matrix $\underline{\underline{C}}$, $$\underline{\underline{C}} = \begin{bmatrix} C_S & -C_J & -C_J \\ -C_J & C_S & -C_J \\ -C_J & -C_J & C_S \end{bmatrix},$$

where $C_s = C_C + C_G + 3C_J$ with $C_J$ being the capacitance of each Josephson junction, $C_C$ being the coupling capacitance, and $C_G$ being the residual capacitance to ground. For this matrix, $C_M = C_C + C_G + 4C_J$ is the largest eigenvalue. Factoring $C_M$ from $\underline{\underline{C}}^{-1}$, $\underline{\underline{K}}^{-1}$ is found by:

$$\underline{\underline{K}}^{-1} = \begin{bmatrix} 1+\delta & \delta & \delta \\ \delta & 1+\delta & \delta \\ \delta & \delta & 1+\delta \end{bmatrix},$$

where $\delta = \dfrac{C_J}{C_C + C_G + C_J}$.

The inductive terms, corresponding to tunneling through the Josephson junctions 120, are described by $$V(\hat{\varphi}, \Phi) = -\sum_{i=1}^{3}[\cos(\hat{\varphi}_{i+1} - \hat{\varphi}_i - 2\pi A)\cos(\hat{\varphi}_i)],$$

where i+1=4 and i=1 are taken to be the same. This potential is equivalent to the XY model where the phase φ represents the angle of the U(1) degrees of freedom. The acquired Peierls phase factor, $2\pi A$, is equal to the line integral of the vector potential in a counterclockwise fashion around each third of the device:

$$2\pi A = \frac{2\pi}{\Phi_0}\oint A \cdot dl = \frac{2\pi\Phi}{3\Phi_0}.$$

This A corresponds to the frustration of the circuit, i.e., the flux penetration per loop of the device in terms of the magnetic flux quantum. The eigenstates of $H_{CC}$ as $\varepsilon_m$ is dentoed with eigenenergy $\varepsilon_m$, and label the ground state G. These are parametric functions of A, and periodic in A.

The behavior and properties of the central circuit 110, shown in FIG. 2A, generally depend on the relative size of the two characteristic energy scales in the system: the energy associated with Cooper pair tunneling between islands, $E_J$, and the energy associated with putting a single electron on an island, $E_C \sim E_\Sigma$. In the two extreme energy limits, $E_J \ll E_C$ or $E_J \gg E_C$, the relevant excitations are charges or vortices, respectively. Note that charges have the same properties in the charged-dominated regime that vortices have in the tunneling-dominated regime. In the charge-dominated regime, where $E_J \ll E_C$, charges are well-defined, massive particles that feel a Lorentz force in the presence of an electromagnetic field and acquire an Aharanov-B ohm phase (represented in the charge basis as a Peierls phase) when moving around an area containing a magnetic field. However, in this regime, external voltages and other sources of charge disorder, such as offset charge, have a dramatic effect on circuit behavior due to the very small capacitances necessary to achieve large $E_C$.

In the classical tunneling limit, where $E_J \gg E_C$, vortices are the topological excitations of the XY model that behave as massive (and essentially classical) particles. They respond to the presence of external current by experiencing a force perpendicular to the current flow (a Lorentz force), and the presence of external charge on the islands affects a moving vortex the same way a magnetic field affects a moving charge (an Aharanov-Casher effect for vortices). In this way, charges and vortices are dual to each other, with these mirrored properties being manifestations of the charge-vortex duality that exists in Josephson junctions 120. However, the vortex domain has two characteristic excitations: the topological excitations, as just described, as well as plasma oscillations (spin waves in the XY model language) that correspond to the response of a classical circuit of inductors and capacitors with values set by the expectation value of the Josephson inductance for the nominal ground state. The plasma oscillations do not break time-reversal symmetry; in essence, the Meissner effect traps flux in the vortices, and thus, all time-reversal symmetry-breaking terms arise only from vortex motion. When $E_J \gg E_C$, this motion becomes exponentially slow due to the challenge of tunneling between allowed current configurations, and thus, one cannot make a circulator in this regime.

An energy regime is identified using this duality, where time-reversal symmetry is broken in the microwave regime and charge noise is not relevant. $E_J \sim E_C$ is focused on as a regime where vortices can move and charge noise may be reduced, enabling the potential for noise-resistant nonreciprocity in the form of unidirectional signal transmission that is robust in the presence of random variation in offset charge. In this way, the circulator 100 may act as an ideal circulator.

In what follows, the connection of each of the first, second and third superconducting island 112, 114, 116 to ground via an additional Josephson junction 120a is leveraged to enable large charge number fluctuations and suppress charge noise. This leads to circulator performance driven by vortex behavior rather than Cooper pair behavior.

To explore the vortex picture, $E_J=4E_C$ is set to ensure that there are sufficient phase fluctuations to warrant a quantum treatment of the vortex dynamics, and numerically diagonalize $H_{CC}$ for a range of A from 0 to 0.5, as the eigenvalues are symmetric in A→−A and periodic (same for A+1 as for A). The corresponding energy eigenstates $\varepsilon_n$ and eigenvalues $\varepsilon_n$, are set with implicit dependence on A. The chosen parameters ($E_J=4E_C\approx 45$ GHz) and eventual optimum operating point (near A≈0.2478), that the lowest energy spin-wave excitation occurs at 20 GHz, far higher than the low-energy excitations (in the few GHz regime) are considered. The predominant dynamics are expected to be that of vortices, not spin waves.

The full Hilbert space is approximated by using a charge basis $n_1$, $n_2$, $n_3$ for Cooper pairs on each island, with $|n_i|\leq 4$. The truncation was checked and no difference was found by incrementing the maximum allowed charge by one. This creates a Hilbert space dimension of $9^3$ and is straightforward to solve on a personal computer. The presence of level-crossings at A≈0.2 and A≈0.26 within the first four energy levels due to the high symmetry of the central circuit 110.

Figure 3A:
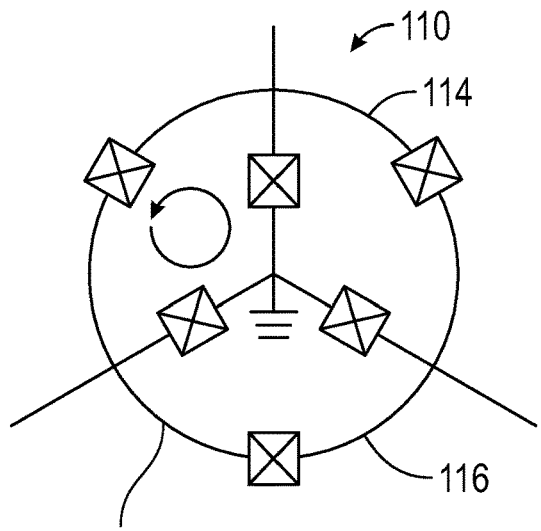
FIGS. 3A-3C illustrate persistent current vortexes that may exist in each third of the central circuit of FIG. 2A, in accordance with examples of the present disclosure.
Figure 3B:
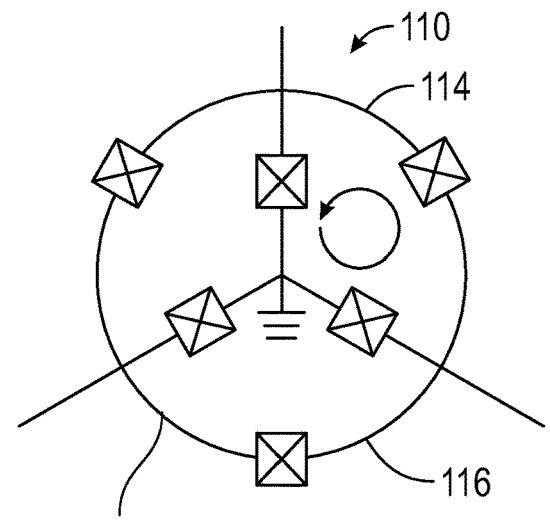
Figure 3C:
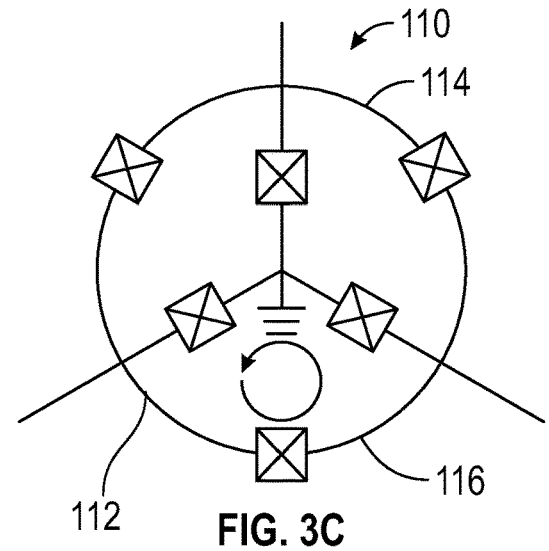

The persistent current around each third of the central circuit is:

$$\hat{I}_i = \sin(\hat{\varphi}_{i+1} - \hat{\varphi}_i - 2\pi A) + \sin(\hat{\varphi}_i) - \sin(\hat{\varphi}_{i+1}),$$

where i+1=4 and i=1 are taken to be the same. To find the true current in the central circuit 110, one multiplies $\hat{I}_i$ by $I_C$, the single-junction critical current. FIGS. 3A-3C shows a schematic representation of each of these loop currents for the model of interest.

A local vortex is identified by a nonzero loop current in one or two of the three loops. Note that if all three loop currents are equal, there is only a persistent current circulating about the exterior. For the energy eigenstates, the expectation values of each of the three loop currents are the same, and thus the eigenstates do not correspond to localized vortex states, though each eigenstate has a distinct persistent current around the exterior of the circuit. The level crossings manifest themselves in the subsequent persistent-current analysis, proving them to be regions of flux that create dramatic changes in behavior due to changes in the nature of the ground state.

While there are no localized vortices for energy eigenstates, an incoming microwave photon can lead to the excitation of superpositions of circuit states. To examine this, the matrix elements of the three loop-currents over the first three eigenstates $\{\varepsilon_0(=G), \varepsilon_1, \varepsilon_2\}$, denoted $I_i^{kl}=\varepsilon_k \hat{I}_i \varepsilon_l$, are considered. The symmetry of the circuit requires that the absolute value of each of the loop-current operator matrix elements be independent of i, that is, the loop to which they correspond. However, superpositions of eigenstates exhibit localized vortices due to nontrivial phases of the off-diagonal matrix elements $I_i^{kl}$ for k≠l.

The argument of the $I_i^{mn}$ matrix elements are written as $\phi_i^{mn}$. The differences $\phi_i^{mn}-\phi_{i+1}^{mn}$ only take the values $\{0, \pm 2\pi/3\}$, as expected by the three-fold symmetry of the central circuit 110. Examining a superposition $c_m\varepsilon_m+c_n\varepsilon_n$ with m>n, the $i^{th}$ loop-current operator has an expectation value at time t of $$\langle \hat{I}_i(t)\rangle = |c_m|^2 I_i^{mm} + |c_n|^2 I_i^{nn} + 2|c_m||c_n||I_i^{mn}|\times\cos(\omega_{mn}t - \theta_{mn}+\phi_i^{mn}),$$

where $\phi_i^{mn}$ is the argument of the off-diagonal matrix element $I_i^{mn}$, $\theta_{mn}$ is the argument of $c_m^* c_n$, and $$\omega_{mn} = \frac{(E_m - E_n)}{\hbar}.$$

Thus, in general, a superposition of two states has a local vortex, and that these local vortices circulate (countercirculate) about the central circuit 110 when $\phi_i^{mn}-\phi_{i+1}^{mn}=\pm 2\pi/3$ at a frequency $\omega_{mn}$. Accordingly, the directional function for the difference in $\phi_i^{mn}$ variables modulo $2\pi$ are defined as $$\Theta^{mn} = \begin{cases} +1 \\ 0 \\ -1 \end{cases} \text{ if } \phi_i^{mn} - \phi_{i+1}^{mn} = \begin{cases} +2\pi/3 \\ 0 \\ -2\pi/3 \end{cases},$$

to allow for plotting the behavior of potential local vortices for different values of m, n, and A, including the existence or absence of vortex circulation and what direction. $\Theta^{mn}$ takes the value +1 for clockwise circulation, −1 for counterclockwise circulation, and 0 for no circulation (absence of a local vortex).

The central circuit 110 is capacitively coupled at each island to a resonator 122 and voltage source 124, as shown in FIG. 1. These resonators 122 are included to enable effective impedance matching between incoming microwave signals and the central circuit 110, and will be tuned in frequency and coupling to enable optimal performance. Each resonator 122 is opened to an external source of microwaves, i.e., a transmission line 126, allowing signals to flow into and out of the central circuit 110. The central circuit 110, is threaded by an external flux Φ via the application of an external magnetic field. It is contemplated that each of the resonators 122 may be strongly coupled to each of the first, the second, and the third superconducting islands 112, 114, 116. Strongly coupled is defined herein as having a coupling strength in excess of 100 MHz. Weakly coupled is herein defined as having a coupling strength of less than 100 MHz.

The Hamiltonian for this central circuit 110 is composed of terms corresponding to the transmission lines 126, resonators 122, and central circuit 110, as well as each circuit-resonator interaction and resonator-transmission line interaction. Generally, this may be written as:

$$H=H_{TL}+H_R+H_{CC}+H_{CC-R}+H_{R-TL}.$$

Taking the weak-coupling limit, the rotating-wave approximation, and the Markov approximation, each term of the Hamiltonian can be expressed as:

$$H_{TL} = \sum_{k=1}^{3}\int d\nu \hbar\nu \hat{b}_k^\dagger(\nu)\hat{b}_k(\nu)$$

$$H_R = \sum_{k=1}^{3}\hbar\omega_R \hat{a}_k^\dagger \hat{a}_k$$

$$H_{CC} = 4E_\Sigma(\hat{\underline{N}}-\underline{N}_g)^T \underline{K}^{-1}(\hat{\underline{N}}-\underline{N}_g) + E_J V(\hat{\underline{\varphi}},\Phi)$$

$$H_{CC-R} = \sum_{k=1}^{3}\hbar g(\hat{a}_k+\hat{a}_k^\dagger)\hat{B}_k$$

$$H_{R-TL} = \sum_{k=1}^{3}\int d\nu \hbar\sqrt{\frac{\kappa}{2\pi}}\left(\hat{b}_k^\dagger(\nu)\hat{a}_k - \hat{a}_k^\dagger \hat{b}_k(\nu)\right)$$

$H_{TL}$ describes each transmission line as containing an identical continuous spectrum of modes over frequency ν. $H_R$ is the contribution from the circulator's 100 three identical resonators 122, consisting of a single low-lying mode with a characteristic frequency $\omega_R$. The operators $\hat{a}_k^\dagger$ and $\hat{a}_k$ create or destroy a photon in the $k^{th}$ resonator and satisfy the usual commutation relation: $[\hat{a}_j, \hat{a}_k^\dagger]=\delta_{jk}$. Similarly, $\hat{b}_k^\dagger(\nu)$ and $\hat{b}_k(\nu)$ create or destroy a photon in the $k^{th}$ transmission line and satisfy the commutation relation:

$$[\hat{b}_j(\nu),\hat{b}_k^\dagger(\nu')]=\delta_{jk}\delta(\nu-\nu').$$

$H_{CC-R}$ and $H_{R-TL}$ are the interactions between each superconducting island 112, 114, 116, and resonator 122 and between each resonator 122 and transmission line 126, respectively. By treating all resonators 122 and all transmission lines 126 as identical, the coupling constants, g and k, are taken to be identical across all three interactions, and may be later optimized to ensure the best circulator performance. The operator $\hat{B}_k$, is a dimensionless operator corresponding to the dimensionless voltage on the $k^{th}$ island, defined as the $k^{th}$ row of $\hat{\underline{B}}=\underline{K}^{-1}\hat{\underline{N}}$.

Lastly, $H_{CC}$ describes the central superconducting circuit. Applied voltages $V_{gk}$ (shown in FIG. 1) are included that can lead to charge offset noise $N_{gk}$ on each island.

For this analysis, which uses the low-power, single excitation limit, only one photon is considered as input to or output from the central circuit 110 and requires that the excitation energy in the central circuit 110 only exist in one component of the central circuit 110 at any one time, in one of the resonators 122, one of the transmission lines 126, or as an excited state of the central circuit 110. Upon enforcing this limit, the S-matrix of the central circuit 110 is established using input-output theory. First, a generic state in this single excitation manifold is written as:

$$\Psi_0=\Sigma_{k=1}^{3}d_k \hat{a}_k^\dagger G+\Sigma_n c_n \varepsilon_n+\Sigma_{k=1}^{3}\int d\nu f_k(\nu)\hat{b}_k^\dagger(\nu)G,$$

where $d_k$, $c_n$, and $f_k(\nu)$ are time-dependent complex probability amplitudes for each state, and are abbreviated, with a slight abuse of notation, the ground state 0,0,0, G, 0,0,0 as G, and the excited circuit state with no photons in any resonator or transmission line 0,0,0, $\varepsilon_n$,0,0,0 as $\varepsilon_n$. The summation over n is a summation over only the excited states of the central circuit 110, it excludes the ground state as this state is not in the manifold being considered.

By using the Schrödinger equation, equations of motion for the time-varying complex probability amplitudes appearing in $\Psi_0$ are established. With these equations of motion, input-output theory is utilized to develop a relation connecting in-going and out-going mode amplitudes via the S-matrix. Proceeding with this analysis results in the usual input-output relation, $$\underline{f}_{out}(\omega) = \underline{S}(\omega)\underline{f}_{in}(\omega),$$

where $f_{in}(\omega)$ and $f_{out}(\omega)$ are the in-going and out-going single-photon mode amplitudes in frequency space that reference either the initial or final time $t_s$ defined by:

$$\frac{1}{\sqrt{2\pi}}\int dv e^{-iv(t-t_s)} f_k(v, t_s) = \begin{cases} f_{in,k} & \text{if } t > t_s \\ f_{out,k} & \text{if } t < t_s \end{cases}.$$

The single-photon S-matrix is found by solution in the frequency domain for the coefficients in the ansatz, $\Psi_0$. In frequency space yields:

$$\underline{S}(\omega) = 1_{3\times 3} + \kappa \underline{\chi}(\omega),$$

where the inverse susceptibility of the resonators combined with the central circuit is given by:

$$\underline{\chi}^{-1}(\omega) = \left[i(\omega - \omega_R) - \frac{\kappa}{2}\right]1_{3\times 3} + g^2 \underline{T}(\omega).$$

The elements of the term $\underline{T}(\omega)$ are defined relative to starting in the ground state of the central circuit:

$$T_{jk}(\omega) = \sum_n \frac{1}{i\omega - i\varepsilon_n/\hbar} G\hat{B}_j \varepsilon_n \varepsilon_n \hat{B}_k G,$$

Having established the constituent pieces of this single photon S-matrix, the conditions for ideal circulation can be determined.

Having established the S-matrix using input-output theory, what conditions exist on parameters of the circuit such that this matrix matches that of an ideal circulator's S-matrix may be determined:

$$\underline{S}_{CCW} = \begin{bmatrix} 0 & 1 & 0 \\ 0 & 0 & 1 \\ 1 & 0 & 0 \end{bmatrix}, \underline{S}_{CW} = \begin{bmatrix} 0 & 0 & 1 \\ 1 & 0 & 0 \\ 0 & 1 & 0 \end{bmatrix}.$$

Any nonreciprocal behavior must originate from the circuit-specific term in the S-matrix, $\underline{T}(\omega)$, as all other components are trivially diagonal. Focusing on this coupling matrix, conditions for nonreciprocity may be found. Since the central circuit is symmetric with respect to cyclic permutation, the diagonal elements of $\underline{T}(\omega)$ are all equal, as are the off-diagonal elements that are cyclic permutations of each other, i.e., $T_{12}=T_{23}=T_{31}$ and $T_{21}=T_{32}=T_{13}$. With this in mind:

$$\underline{T}(\omega) = -i\begin{bmatrix} \beta & \alpha & \alpha^* \\ \alpha^* & \beta & \alpha \\ \alpha & \alpha^* & \beta \end{bmatrix},$$

with $\alpha = iT_{jj+1}$ and $\beta = iT_{jj}$.

This problem can be solved exactly. Doing so reveals that optimal performance will occur when frequency shifts of the resonators due to the central circuit are compensated, and when the coupling to the central circuit is matched to the resonator decay. Explicitly, for a signal at target frequency $\omega_T$, these conditions are:

$$\omega_R = \omega_T - g^2 \beta,$$

and $$\kappa = 2|\alpha|g^2.$$

Rewriting $\underline{S}(\omega_T)$ for these optimal values, yields the following matrix equation:

$$\underline{S}(\omega_T) = 1 - \frac{2}{1 + i\begin{pmatrix} 0 & e^{i\Delta\theta/6} & e^{-i\Delta\theta/6} \\ e^{-i\Delta\theta/6} & 0 & e^{i\Delta\theta/6} \\ e^{i\Delta\theta/6} & e^{-i\Delta\theta/6} & 0 \end{pmatrix}}.$$

This shows that near resonance ($\omega \approx \omega_T$), the S-matrix will be dominated by the behavior of $\underline{T}(\omega)$. The first terms that contribute to nonreciprocal behavior can be understood by expanding $(1+i\eta \underline{T}(\omega))^{-1}$ in $\eta < |T|$. In Terms in the series correspond to clockwise or counterclockwise circulation beginning and ending at the same port, namely $T_{21}$ $T_{32}$ $T_{13}$ and $T_{12}$ $T_{23}$ $T_{31}$, respectively. If the central circuit is reciprocal, the quantity $|T_{12} T_{23} T_{31} - T_{21} T_{32} T_{13}|$, which represents the destructive interference between a signal going clockwise and counterclockwise around the circuit, should be zero. However, if the central circuit 110 is ideally nonreciprocal, they instead constructively interfere. Writing $\alpha = |\alpha|e^{i\Delta\theta/6}$, in terms of the difference accumulated between a clockwise and counterclockwise path $\Delta\theta$, yield $|T_{12}T_{23}T_{31} - T_{21}T_{32}T_{13}| = 2|\alpha|^3 |\sin(\Delta\theta/2)|$. Thus for optimal behavior, $$\Delta\theta = \begin{cases} 0, \pm 2\pi \ldots, & \text{Reciprocal} \\ \pm \pi, \pm 3\pi \ldots, & \text{Nonreciprocal} \end{cases}$$

These three conditions on the central circuit 110 that, when satisfied, yield ideal circulation in either the clockwise or counterclockwise direction:

$$\omega_T s.t. \Delta\theta = \pm\pi, \pm 3\pi \ldots \quad \text{(a)}$$

$$K = 2|\alpha|g^2 \quad \text{(b)}$$

$$\omega_R = \omega_T - g^2 \beta \quad \text{(c)}$$

With these conditions, as long as the central circuit has a target frequency for which the phase difference condition in the above equation holds, one of the external circuit parameters may be chosen and let the conditions given in equations (b) or (c) determine the others. Additionally, these results specify the phase differences corresponding to clockwise (CW) or counterclockwise (CCW) transmission, yielding:

$$\Delta\theta = \begin{cases} -\pi, 3\pi, -5\pi \ldots, & CW\text{ Transmission} \\ \pi, -3\pi, 5\pi \ldots, & CCW\text{ Transmission} \end{cases}$$

As there are a variety of different regimes of the central circuit 110, several values of external flux A are investigated. The best performing region was identified near $A \approx 0.2478$.

To evaluate performance, the elements of $\underline{T}(\omega)$ are computed using the energy eigenstates and eigenvalues established numerically. With the elements of $\underline{T}(\omega)$, the phase difference $\Delta\theta$ as a function of potential incoming signal frequency ω is found. Examining the phase difference allows us to identify target frequencies where Δθ=±π, ±3π ..., and use equations (b) and (c) above to set external circuit parameters that fix κ, $\omega_R$, and g. Relevant S-matrix properties can be examined, as well as introduce variation in the offset charge on each island and flux penetration per loop to test the central circuit's 110 susceptibility to charge and flux disorder, i.e., variations of these parameters on timescales well below the circuit's bandwidth.

Performance is determined via the S-matrix property that the normalized output power at the $i^{th}$ port provided input at the $j^{th}$ port is given by $|S_{ij}|^2$. Setting the external circuit parameters g, κ, and $\omega_R$ for the center frequencies $\omega_{Ti}$ with i=1, 2, 3, 4, the target frequencies, fixing g to a reasonable but large value of g=1.6 GHz and using equations (a), (b), and (c) to determine K and $\omega_R$. Table 1 shows the resulting parameters for the first four target frequencies. For large bandwidth operation (e.g., greater than about 100 MHz), g needs to be large, but making stronger coupling to the resonator has limits in other relevant parameters. Given the size of K needed for a larger g, the line impedance should be tuned to enable this strong coupling, resulting in $Z_{TL} \approx k\Omega$. While this is very large, this is a microwave engineering challenge that may have various solutions, such as inductively coupling, rather than capacitively coupling, the transmission lines to the resonators.

TABLE 1

External Circuit Parameters for Nonreciprocal Points

| Point | $\omega_T$ (GHz) | g (GHz) | κ (GHz) | $\omega_R$ (GHz) |
|---|---|---|---|---|
| 1 | 2.5137 | 1.6 | 0.01321 | 2.7408 |
| 2 | 2.8904 | 1.6 | 0.00995 | 3.1343 |
| 3 | 4.0005 | 1.6 | 0.08998 | 4.3396 |
| 4 | 5.4618 | 1.6 | 1.67917 | 5.7508 |

The bandwidth is defined as a 3 dB window: the width of the signal in frequency space over which transmission is greater than 50%. The parameters for the first and second points result in bandwidths of approximately 23 MHz and 17 MHz, respectively. At the third and fourth points, however, much larger bandwidths are realized. At the third point a bandwidth of approximately 144 MHz is found, while the parameter set for the fourth point yields a very large bandwidth of approximately 1.34 GHz. Larger bandwidth is achieved when nonreciprocal points are situated near resonances, e.g., the fourth point, providing greater ease in inserting energy into the central circuit 110 (that is, a large |α|) and a larger range of frequencies over which it is possible to do so. Since this large bandwidth is desirable in systems such as these, proceeding using the external circuit parameters for the fourth point (at Δθ=−π where $\omega_{T4} \approx 5.46$ GHz).

Upon fixing external circuit parameters to maximize bandwidth, nonreciprocal behavior and ideal circulation in the central circuit 110 are examined. Thus, transmission is compared from a single port to each of the three outputs, plotting the normalized output powers (in dB) at each port provided input at a single port to observe any circulator behavior.

In some examples, by replacing the central ground with a floating island (e.g., the capacitive central island 119), two additional degrees of freedom are introduced, the charge number and phase on this new island, $\hat{N}_0$ and $\hat{\varphi}_0$, respectively. The capacitive central island 119 should mimic a ground node, which may be accomplished by increasing the capacitive central island's 119 capacitance via its physical size. However, in doing so, the self-capacitance of the now large the capacitive central island 119 should be taken into account, as well as the associated mutual capacitance it has with the outer three islands (e.g., the three superconducting islands 112, 114, 116).

The modified Hamiltonian for the capacitive central island 119 is given by:

$$H=(2e)^2/2(\underline{\hat{N}}-\underline{N}_g)^T\underline{\underline{C}}^{-1}(\underline{\hat{N}}-\underline{N}_g),-E_J\Sigma_{i=1}^3[\cos(\hat{\varphi}_i-\hat{\varphi}_0)+\cos(\hat{\varphi}_{i+1}-\hat{\varphi}_i-2\pi A)]$$

where now $\underline{\hat{N}}=\{\hat{N}_1, \hat{N}_2, \hat{N}_3 \hat{N}_0\}$ and $\underline{N}_g=\{N_{g1}, N_{g2}, N_{g3}, 0\}$. The capacitance matrix $\underline{\underline{C}}$ is now a 4×4 matrix with the form:

$$\underline{\underline{C}} = \begin{bmatrix} C'_S & -C_J & -C_J & -C_F \\ -C_J & C'_S & -C_J & -C_F \\ -C_J & -C_J & C'_S & -C_F \\ -C_F & -C_F & -C_F & C_0+3C_F \end{bmatrix},$$

where $C'_s = C_C + C_G + C_\mu + 3C_J$ and $C_F = C_J + C_\mu$, with $C_0$ the self-capacitance of the center island, $C_\mu$, the mutual capacitance between it and the outer islands, and all other capacitances as noted above. The eigenvalues of the capacitance matrix is expressed as:

$$\lambda_1=\mu_2=C_C+C_G+C_\mu+4C_J \lambda_3\mu_4=C_0(C_C+C_G+C_\mu+C_J),+3(C_\mu+C_J)(C_C+C_G)$$

and define the quantity $\lambda'=C_0C_J+(C_J+C_\mu)(4C_J+C_\mu)$ so that the inverse capacitance matrix $\underline{\underline{C}}^{-1}$ may be written in the compact form:

$$\underline{\underline{C}}^{-1} = \frac{1}{\lambda_1}\begin{bmatrix} 1+\delta' & \delta' & \delta' & \eta \\ \delta' & 1+\delta' & \delta' & \eta \\ \delta' & \delta' & 1+\delta' & \eta \\ \eta & \eta & \eta & \xi \end{bmatrix},$$

where $\delta' = \frac{\lambda'}{\lambda_3\lambda_4}, \eta = \frac{\lambda_1(C_J+C_\mu)}{\lambda_3\lambda_4}$, and $\xi = \frac{\lambda_1(\lambda_1-3C_J)}{\lambda_3\lambda_4}$.

Notably, by replacing the central ground with the floating capacitive central island 119, this alternative central circuit is now charge-conserving. The total charge operator is defined as $\hat{N}_T=\hat{N}_0+\Sigma_{i=1}^3\hat{N}_i$, which commutes with the Hamiltonian [H, $\hat{N}_T$]=0 and whose expectation value is constant, yielding the total charge in the system $\langle\hat{N}_T\rangle$=n. With this conserved quantity, a dynamical degree of freedom may be eliminated.

In particular, by considering the unitary transformation $$\hat{U}=e^{-i\Sigma_{i=1}^3\hat{N}_i\hat{\varphi}^0},$$

we can eliminate the charge number and phase operators of the capacitive central island 119 from the Hamiltonian. Under this transformation, the charge number operators of the outer islands are unaffected while the charge number operator of the capacitive central island 119 transforms as $\hat{N}_0 \to \hat{N}_0 - \Sigma_{i=1}^3\hat{N}_i$. Similarly, the phase operators of the outer islands transform as $\hat{\varphi}_i \to \hat{\varphi}_i + \hat{\varphi}_0$ while that of the capacitive central island 119 is unchanged. Note that the total charge operator transforms as $\hat{N}_T \to \hat{N}_0$, i.e., in this new frame $\hat{N}_0$ represents total charge and is the conserved quantity.

Performing the unitary transformation in $\hat{U}=e^{-i\Sigma_{i=1}^3 \hat{N}_i \phi^0}$ on the Hamiltonian, the Hamiltonian in this frame takes a form:

$$H' = 4E'_\Sigma (\underline{\hat{N}} - \underline{N}'_g)^T \underline{K}'^{-1}(\underline{\hat{N}} - \underline{N}'_g) - E_J \Sigma_{i=1}^3 [\cos(\hat{\phi}_i) + \cos(\hat{\phi}_{i+1} - \hat{\phi}_i - 2\pi A)]$$

where $\underline{\hat{N}} = \{\hat{N}_1, \hat{N}_2, \hat{N}_3\}$, $\underline{N}'_g = \{N'_{g1}, N'_{g2}, N'_{g3}\}$. The form of the Hamiltonian in this frame is identical to that of our original model [$H_{CC}$], where now the charging energy of the circuit $E'_\Sigma$, its dimensionless inverse capacitance matrix $\underline{K}'^{-1}$, and the offset charges $N'_{gi}$ all take on slightly modified forms. $E'_\Sigma$ is defined as $$E'_\Sigma = \frac{e^2}{2\lambda_1},$$

where $\lambda_1 = C_C + C_G + C_\mu + 4C_J$ plays the role of $C_M$ from the main text but modified by the presence of $C_\mu$. $\underline{K}'^{-1}$ takes a familiar form:

$$\underline{K}'^{-1} = \begin{bmatrix} 1+\rho & \rho & \rho \\ \rho & 1+\rho & \rho \\ \rho & \rho & 1+\rho \end{bmatrix},$$

where $\rho = \delta' - 2\eta + \xi$ giving $\delta \to \rho$. Finally, the new offset charges are uniformly shifted from their original value:

$$N'_{gi} = N_{gi} - \frac{\eta - \xi}{1+3\rho}(\hat{N}_0 - \Sigma_{j=1}^3 N_{gj}).$$

Note that in the limit where $C_0 \to \infty$ and $C_\mu \to 0$, these modified components revert to the forms specific to $H_{CC}$ (the original model's Hamiltonian). However, provided a relatively large $C_0$ and small $C_\mu$ (e.g., $C_0 = 30 C_J$ and $C_\mu = 0.25 C_J$ suffice), similar transmission performance is found in a zero-noise setting as compared with that of the original circuit with a central ground. Aside from the more straightforward parameter-related modifications to $E'_\Sigma$ and $\underline{K}'^{-1}$, the presence of this new floating central island is equivalent to our original model with the addition of an offset charge that acts symmetrically on each island.

Figure 4A:
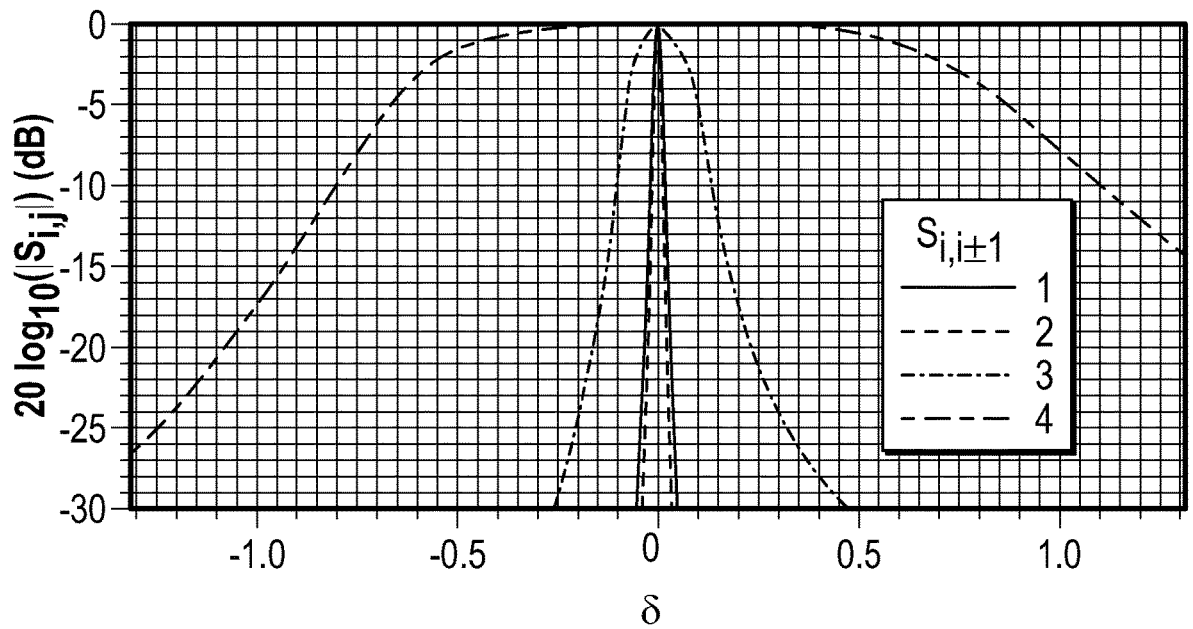
FIGS. 4A-4F are graphs illustrating performance metrics of the circulator of FIG. 1, in accordance with examples of the present disclosure.
Figure 4B:
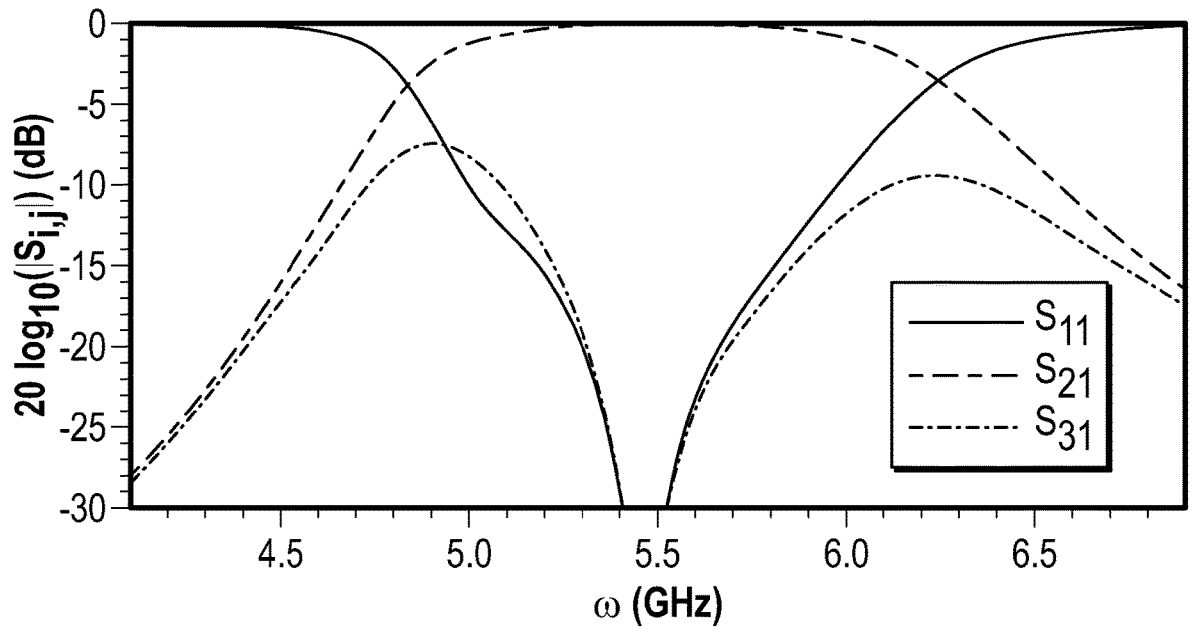

FIGS. 4A-F illustrate relevant performance metrics of the model, namely, bandwidth (FIG. 4A) for several operating frequencies, and (FIG. 4B) highlighting the largest of these) and noise performance (FIGS. 4C-4F). For the central circuit 110 with a central grounded island 118, FIG. 4A shows transmission bandwidth for four different target operating frequencies, given in Table I. In FIG. 4B that microwave signals only propagate in one direction; there is a clear preferred direction of signal transmission, with full transmission at $\omega \approx 5.46$ GHz in the clockwise direction. FIG. 4B demonstrates the central circuit 110 is lossless and nonreciprocal, and at $\omega \approx 5.46$ GHz, matched, all characteristics of an ideal circulator's S-matrix. Note that due to the three-fold rotational symmetry of the central circuit 110, these results are reproduced under all cyclic permutations.

Thus far, the analysis has assumed high symmetry: identical, static offset charges $N_{gi}$ on each island due to the presence of applied voltages $V_{gi}$ as well as identical loop areas in the central circuit (ensuring identical flux penetration per loop). In particular, given the expectation that charge offset is not a strong effect, $N_{g1} = N_{g2} = N_{g3} \approx 0.4$ Cooper pairs, $A \approx 0.2478$, are arbitrarily set, and subsequently tuned the external circuit parameters for ideal circulation in the prior parts of this section. However, sources of noise that break this high symmetry are inevitable. Each island of the superconducting central circuit 110 may be subject to random variation in the offset charge that will necessarily affect performance given the intermediate energy regime. Similarly, static flux variations across the device due to imperfections in manufacture of the central circuit or local impurities, unexpected magnetic field gradients, and other phenomena will likely degrade the ideal circulation.

To test the central circuit's 110 susceptibility to local charge noise, initially, the central circuit 110 is tuned for ideal circulator behavior with equal, fixed offset charges $N_{gi}$. An additional offset charge $\Delta_i$ that is unique for each island is introduced and randomly sampled from a normal distribution with a mean of $N_\mu = 0$ and a standard deviation $N_\sigma$ in units of Cooper pair number. Performance is assessed in the presence of charge noise by examining $ER_0^\gamma$ and $\gamma$ as a function of $N_\sigma$, shown in FIGS. 4C and 4E respectively. These quantities convey the distribution of the minimum of the extinction ratio for those noise samples resulting in less than 1 dB of insertion loss and the likelihood that this is the case using a sample size of 1200 noise samples.

Figure 4C:
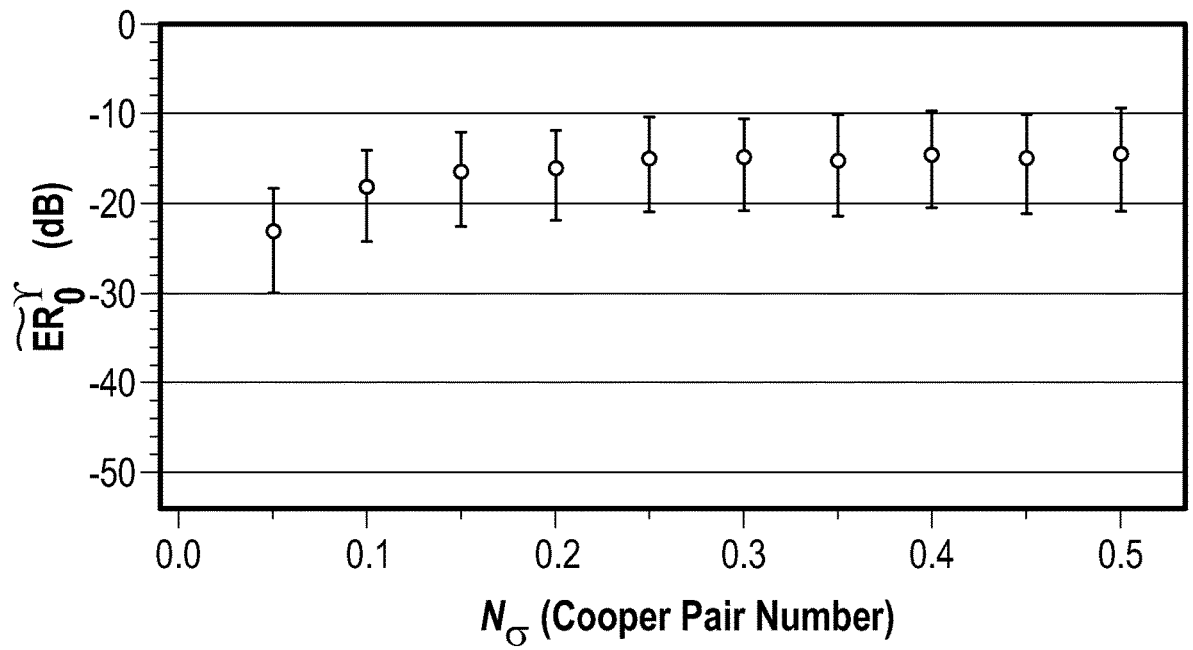
Figure 4D:
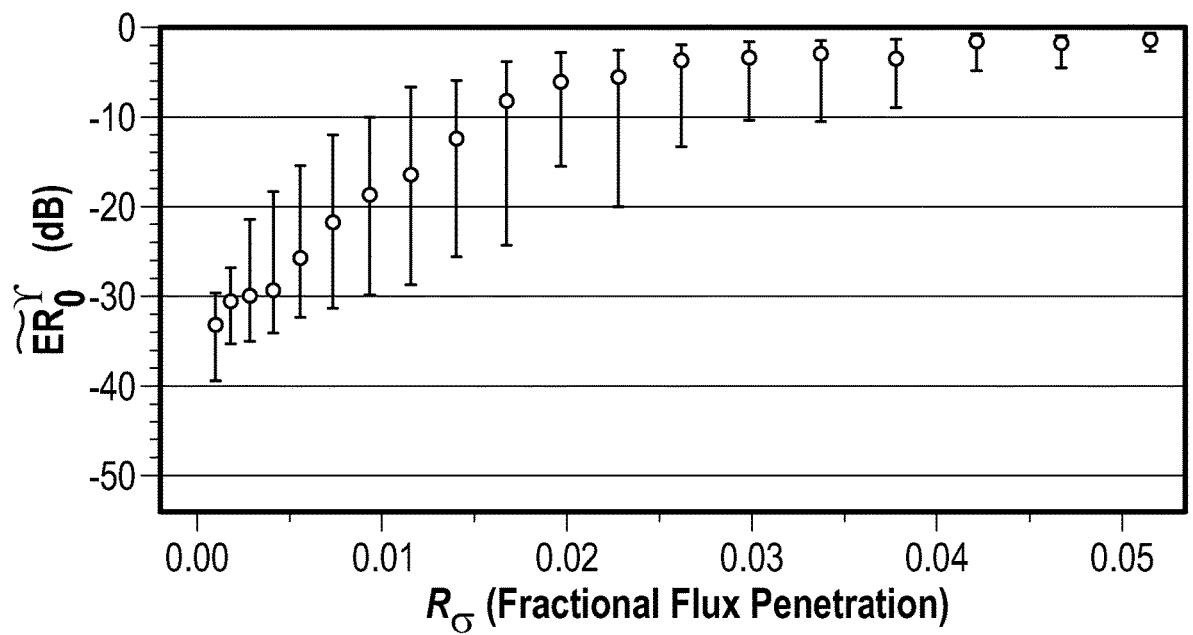
Figure 4E:
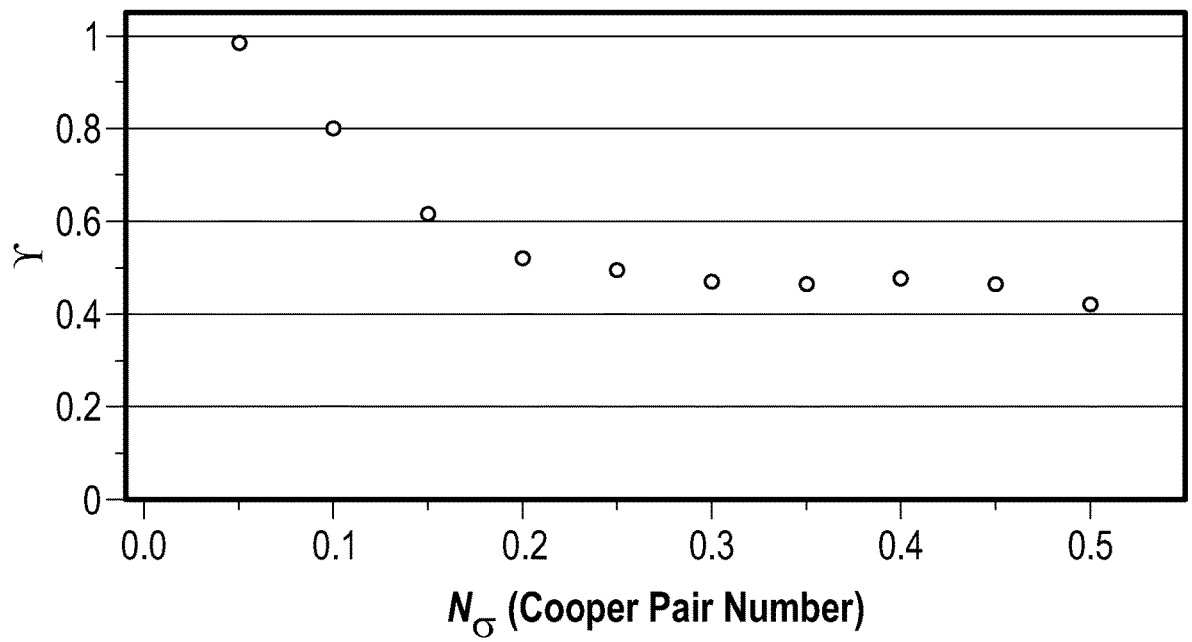
Figure 4F:
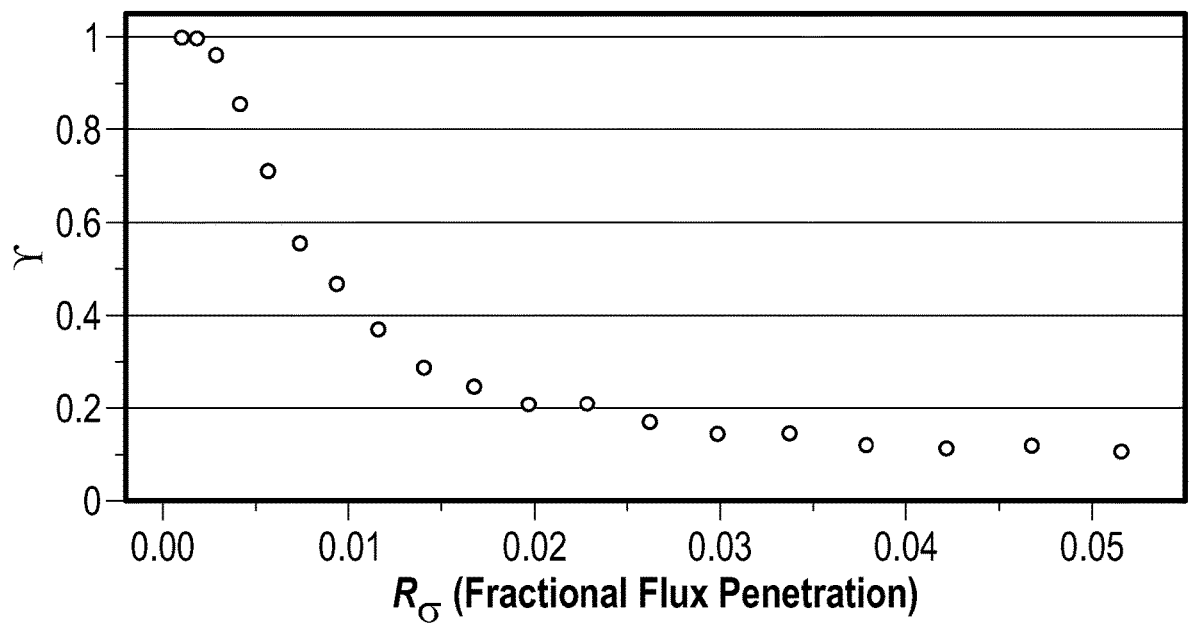

Upon increasing $N_\sigma$, an initial slight decrease in performance indicated by the increase in $\widetilde{ER}_0^\gamma$ (the median of the distribution of $ER_0^\gamma$), as shown in FIG. 4C. However, at $N_\sigma \approx 0.25$ Cooper pairs saturation to $\widetilde{ER}_0^\gamma \approx -15$ dB is observed. This saturation is reasonable given that the behavior of the circuit is unchanged upon rescaling by any integer number of Cooper pairs. Once $N_\sigma$ exceeds $\approx 0.25$, the distribution is wide enough to encompass this rescaling. In FIG. 4E, the device yield $\gamma$ displays similar behavior with increasing $N_\sigma$, where the likelihood of large transmission also saturates at $\approx 0.25$ to about 50%. Even in the presence of essentially arbitrary, static charge noise, the central circuit 110 retains its nonreciprocity.

To test the central circuit's 110 susceptibility to flux noise, initially, the central circuit 110 is tuned for ideal circulator behavior where all three loops of the central circuit are equal in area and penetrated by a flux $A \approx 0.2478$. Variation in the flux penetration of each loop, $\Delta_i$, is introduced, that is unique for each loop but maintains the total area and flux penetration of the ideal case, i.e., $\Delta_1, +\Delta_2, +\Delta_3, =0$, to account for tuning the flux optimally for a given device (where the total field can be varied but not, perhaps, the individual loop fields). $\Delta_i$, to is a fraction of A, the original flux penetration per loop, randomly sampled from a normal distribution with a mean of $R_\mu, =0$ and a standard deviation $R_\sigma$. Performance is assessed in the presence of flux noise by examining $ER_0^\gamma$ and $\gamma$ as a function of $R_\sigma$, shown in FIGS. 4E and 4F respectively. As stated above, $ER_0^\gamma$ and $\gamma$ convey the distribution of the minimum of the extinction ratio for those noise samples resulting in less than 1 dB of insertion loss and the likelihood that this is the case using a sample size of 1200 noise samples.

Upon increasing $R_\sigma$, a decrease in performance is indicated by the increase in $\widetilde{ER}_0^\gamma$ (the median of the distribution of $ER_0^\gamma$). This degradation in performance is more substantial than in the charge noise case, decreasing more rapidly and saturating at $R_\sigma \approx 0.025$ to $\widetilde{ER}_0^\gamma \approx -1$ dB. Note that this flux noise model encompasses both random variations in loop area, e.g., imperfections in manufacture, as well as static flux variations across the device that may occur.

Figure 5:
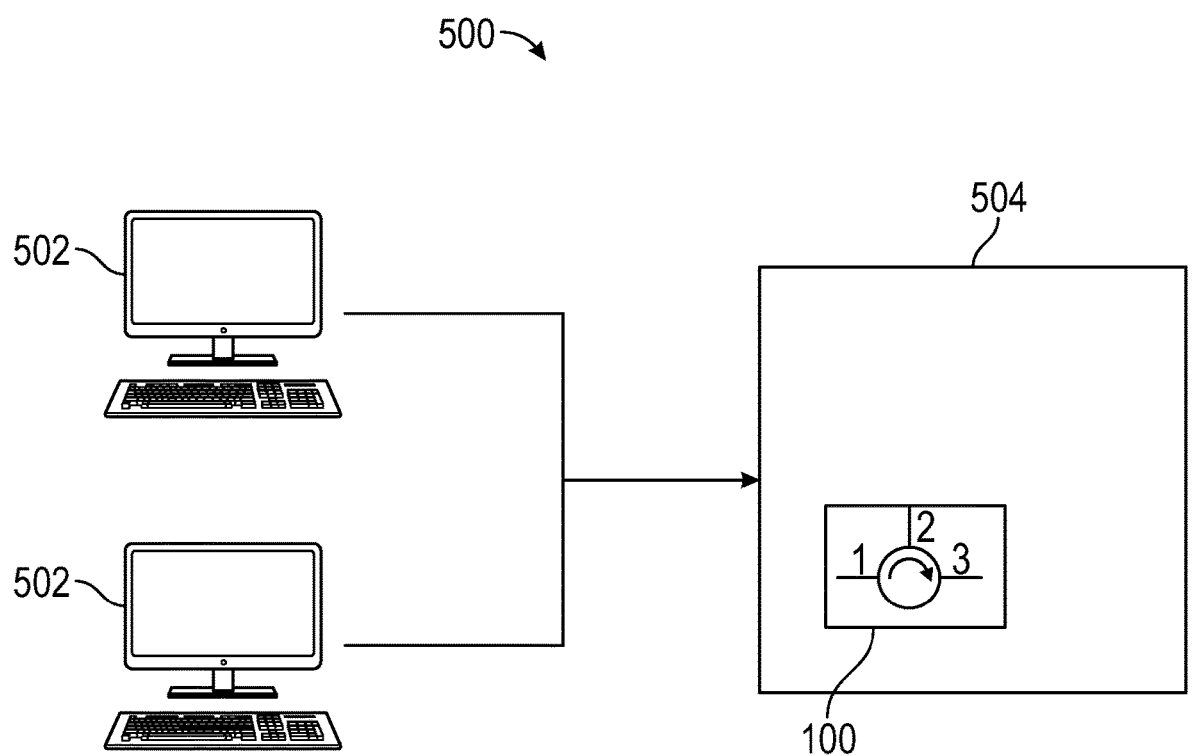
FIG. 5 is a block diagram of a computing system that includes a quantum computing system which includes the circulator of FIG. 1, in accordance with examples of the present disclosure.

Referring to FIG. 5 a computing system 500 is shown. The computing system 500 includes one or more computing devices 502 in communication with a quantum computing system 504. The quantum computing system includes the circulator 100 of FIG. 1. It is contemplated that the computing devices 502 include laptop computers, desktop computers, terminals, servers, and/or any suitable device for communicating with a quantum computing system 504.

Certain embodiments of the present disclosure may include some, all, or none of the above advantages and/or one or more other advantages readily apparent to those skilled in the art from the drawings, descriptions, and claims included herein. Moreover, while specific advantages have been enumerated above, the various embodiments of the present disclosure may include all, some, or none of the enumerated advantages and/or other advantages not specifically enumerated above.

The embodiments disclosed herein are examples of the disclosure and may be embodied in various forms. For instance, although certain embodiments herein are described as separate embodiments, each of the embodiments herein may be combined with one or more of the other embodiments herein. Specific structural and functional details disclosed herein are not to be interpreted as limiting, but as a basis for the claims and as a representative basis for teaching one skilled in the art to variously employ the present disclosure in virtually any appropriately detailed structure. Like reference numerals may refer to similar or identical elements throughout the description of the figures.

The phrases "in an embodiment," "in embodiments," "in various embodiments," "in some embodiments," or "in other embodiments" may each refer to one or more of the same or different example embodiments provided in the present disclosure. A phrase in the form "A or B" means "(A), (B), or (A and B)." A phrase in the form "at least one of A, B, or C" means "(A); (B); (C); (A and B); (A and C); (B and C); or (A, B, and C)."

It should be understood that the foregoing description is only illustrative of the present disclosure. Various alternatives and modifications can be devised by those skilled in the art without departing from the disclosure. Accordingly, the present disclosure is intended to embrace all such alternatives, modifications, and variances. The embodiments described with reference to the attached drawing figures are presented only to demonstrate certain examples of the disclosure. Other elements, steps, methods, and techniques that are insubstantially different from those described above and/or in the appended claims are also intended to be within the scope of the disclosure.

What is claimed is:

1. A method for using a circulator, the method comprising:
operating a circulator in a non-charge-conserved, intermediate regime of Josephson energy,
wherein the circulator includes a central circuit including:
a first superconducting island, a second superconducting island, a third superconducting island, and a central island, each in electrical communication with each other via a plurality of Josephson junctions.

2. The method of claim 1, wherein the central circuit defines a plane.

3. The method of claim 2, further comprising threading the central circuit by an external magnetic field applied perpendicular to the plane.

4. The method of claim 1, wherein the plurality of Josephson junctions include a Josephson energy and a capacitance.

5. The method of claim 1, wherein the central island includes a central ground.

6. The method of claim 1, wherein the central island includes a self-capacitance.

7. The method of claim 1, further comprising capacitively coupling a resonator to each of the first, the second, and the third superconducting islands.

8. The method of claim 7, further comprising: strongly coupling to each of the first, the second, and the third superconducting islands.

9. The method of claim 1, further comprising generating persistent current vortexes.

10. A method for operating a circulator, the method comprising:
operating a circulator in a non-charge-conserved, intermediate regime of Josephson energy, wherein the circulator includes:
a plurality of superconducting islands; and
a central island,
wherein the plurality of superconducting islands and the central island are each in electrical communication with each other via a plurality of Josephson junctions.

11. The method of claim 10, wherein the plurality of superconducting islands define a plane.

12. The method of claim 11, further comprising threading the circulator by an external magnetic field applied perpendicular to the plane.

13. The method of claim 10, wherein the plurality of Josephson junctions include a Josephson energy and a capacitance.

14. The method of claim 10, wherein the central island includes a central ground.

15. The method of claim 10, wherein the central island includes a self-capacitance.

16. The method of claim 10, further comprising capacitively coupling a resonator to each of the plurality of superconducting islands.

17. The method of claim 16, further comprising strongly coupling the resonators to each of the plurality of superconducting islands.

18. A method for using a circulator in a computing system, the method comprising:
operating one or more computing devices in communication with a quantum computing system including a circulator, wherein the circulator comprises:
a first superconducting island, a second superconducting island, a third superconducting island, and a central island, each in electrical communication with each other via a plurality of Josephson junctions; and
operating the circulator in a non-charge-conserved, intermediate regime of Josephson energy.

* * * * *